(12) United States Patent
Chang et al.

(10) Patent No.: US 9,240,521 B2
(45) Date of Patent: Jan. 19, 2016

(54) ELECTRODE STRUCTURE AND LIGHT EMITTING DIODE USING THE SAME

(71) Applicant: Lextar Electronics Corporation, Hsinchu (TW)

(72) Inventors: Po-Yang Chang, Taipei (TW); Tzu-Hung Chou, Zhongli (TW)

(73) Assignee: LEXTAR ELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 14/336,438

(22) Filed: Jul. 21, 2014

(65) Prior Publication Data

US 2015/0129913 A1 May 14, 2015

(30) Foreign Application Priority Data

Nov. 11, 2013 (TW) ............................. 102140911 A (51) Int. Cl.
*H01L 33/40* (2010.01)
*H01L 33/26* (2010.01)
*H01L 31/0224* (2006.01)
*H01M 4/46* (2006.01)

(52) U.S. Cl.
CPC ...... *H01L 33/405* (2013.01); *H01L 31/022433* (2013.01); *H01M 4/463* (2013.01); *H01L 33/26* (2013.01)

(58) Field of Classification Search
CPC .................. H01L 33/405; H01L 33/26; H01L 31/022433
See application file for complete search history.

(56) References Cited

U.S. PATENT DOCUMENTS

| 4,925,524 | A  | * | 5/1990  | Beatty ............................. 216/13 |
| 6,409,930 | B1 | * | 6/2002  | Whitehurst et al. ............. 216/13 |
| 7,190,005 | B2 | * | 3/2007  | Gibb ....................... H01L 33/40 257/103 |
| 8,637,886 | B2 | * | 1/2014  | Tsuji ...................... H01L 33/44 257/100 |
| 8,637,888 | B2 | * | 1/2014  | Hodota ................... H01L 33/38 257/103 |
| 8,653,547 | B2 | * | 2/2014  | Jeong ...................... H01L 33/22 257/84 |
| 2003/0063465 | A1 | * | 4/2003 | McMillan et al. .............. 362/296 |
| 2005/0045990 | A1 | * | 3/2005 | Nakao et al. ................. 257/532 |
| 2006/0261363 | A1 | * | 11/2006 | Venugopalan .................. 257/99 |
| 2013/0081688 | A1 | * | 4/2013 | Liang .............. H01L 31/022425 136/256 |
| 2014/0261390 | A1 | * | 9/2014 | Chernin ................. F24J 2/4652 126/710 |

FOREIGN PATENT DOCUMENTS

| CN | 102687313 A    |   | 9/2012 |
| KR | 2012029330 A   | * | 3/2012 |
| TW | 201029059 A    |   | 8/2010 |
| TW | 201119074 A    |   | 6/2011 |

* cited by examiner

*Primary Examiner* — Ida M Soward
(74) *Attorney, Agent, or Firm* — Moser Taboada (57) ABSTRACT

An electrode structure includes a first diffusion barrier layer, an aluminum reflective layer formed over the first diffusion barrier layer. The aluminum reflective layer has a thickness from about 500 angstroms (Å) to less than 2,000 Å, a second diffusion barrier layer formed over the aluminum reflective layer, and an electrode layer overlying the second diffusion barrier layer. The electrode structure is applicable in a light emitting diode device.

10 Claims, 6 Drawing Sheets

ELECTRODE STRUCTURE AND LIGHT EMITTING DIODE USING THE SAME

RELATED APPLICATIONS

This application claims priority to Taiwan Application Serial Number 102140911, filed Nov. 11, 2013, which is herein incorporated by reference.

BACKGROUND

1. Field of Invention

The present invention relates to an electrode structure. More particularly, the present invention relates to an electrode having an aluminum reflective layer.

2. Description of Related Art

In a conventional electrode structure, a reflective layer is usually introduced under an electrode, which enables photon to escape from a LED die through multiple reflections so as to avoid the absorption of the photon by the electrode and the decrease in brightness of the device. As a result, the light emitting efficiency increases. However, for multiple metal layers in the electrode structure may exhibit various adhesive forces and material properties under an external force, the electrode structure may be broken and suffer peeling issue. For example, due to the silver electrode having different material property from that of the sapphire substrate, the vapor deposition of a silver electrode on a sapphire substrate is likely to have electrode peeling issue under the application of the external force, resulting in a low adherence to the sapphire substrate in the electrode structure.

SUMMARY

Therefore, the present invention provides an electrode structure having an aluminum reflective layer with specific height to have better adherence and lower the probability to generate a peeling issue. And an optical and electrical property and a yield of a light emitting element may not be decreased.

One aspect of the present invention is an electrode structure, including a first diffusion barrier layer; an aluminum reflective layer formed over the first diffusion barrier layer, wherein a thickness of the aluminum reflective layer is in a range from about 500 to less than about 2,000 angstroms; a second diffusion barrier layer formed over the aluminum reflective layer; and an electrode layer overlying the second diffusion barrier layer.

According to various embodiments of the present invention, a material of the electrode layer is selected from a group consisting of gold, silver, titanium, nickel, and a combination thereof.

According to various embodiments of the present invention, a material of the diffusion barrier layer is selected from a group consisting of chromium, platinum, palladium, nickel, rhodium, copper, tungsten, molybdenum, and a combination thereof.

According to various embodiments of the present invention, a solder ball formed over the electrode layer.

According to various embodiments of the present invention, the electrode structure is used in a light emitting diode, solar energy cell or secondary battery.

Another aspect of the present invention is a light emitting diode, including a light emitting structure layer; a first diffusion barrier layer formed over the light emitting structure layer; an aluminum reflective layer formed over the first diffusion barrier layer, wherein a thickness of the aluminum reflective layer is in a range from about 500 to less than about 2,000 angstroms; a second diffusion barrier layer formed over the aluminum reflective layer; and an electrode layer overlying the second diffusion barrier layer.

According to various embodiments of the present invention, the electrode layer is made of a material selected from a group consisting of chromium, platinum, palladium, nickel, rhodium, copper, tungsten, molybdenum, and a combination thereof.

According to various embodiments of the present invention, a material of the diffusion barrier layer is selected from a group consisting of chromium, platinum, palladium, nickel, rhodium, copper, tungsten, molybdenum, and a combination thereof.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

Figure 1:
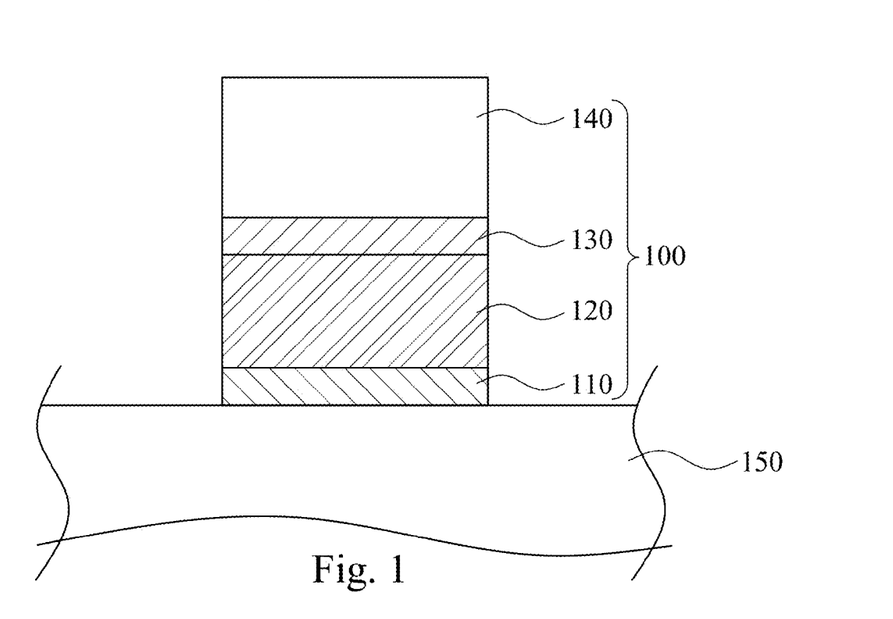
FIG. 1 is a cross sectional view of an electrode structure and a light emitting diode according to various embodiments of the present invention.

Referring to FIG. 1, FIG. 1 is a cross sectional view of an electrode structure according to various embodiments of the present invention. As shown in FIG. 1, according to various embodiments of an electrode structure 100 of one aspect of the present invention, the electrode structure 100 includes a first diffusion barrier layer 110, an aluminum reflective layer 120, a second diffusion barrier layer 130 and an electrode layer 140. More particularly, the aluminum reflective layer 120 is formed over the first diffusion barrier layer, and a thickness of the aluminum reflective layer 120 is in a range from about 500 to less than about 2000 angstroms, for example, 500, 600, 700, 800, 900, 1,000, 1,100, 1,200, 1,300, 1,400, 1,500, 1,600, 1,700, 1,800, or 1,900 angstroms. The second diffusion barrier layer 130 is formed over the aluminum reflective layer 120. The electrode layer 140 is overlying the second diffusion barrier layer 130.

According to various embodiments of the present invention, a material of the first diffusion barrier layer 110 is selected from a group consisting of chromium, platinum, palladium, nickel, rhodium, copper, tungsten, molybdenum, and a combination thereof. The second diffusion barrier layer 130 is made of a material selected from a group consisting of chromium, platinum, palladium, nickel, rhodium, copper, tungsten, molybdenum, and a combination thereof. The material of the first diffusion barrier layer 110 and the second diffusion barrier layer 130 can be the same or different. A material of the electrode layer 140 is selected from a group consisting of gold, silver, titanium, nickel, and a combination thereof.

According to various embodiments of the present invention, the material of the diffusion barrier layer 110, 130 comprises or is chromium. The thickness of the aluminum reflective layer 120 is about 1,000 angstroms. The material of the electrode layer 140 is a material comprising silver.

According to various embodiments of the present invention, the electrode structure is applied in light emitting diode, solar energy cell or secondary battery.

Referring to FIG. 1, FIG. 1 is also a cross sectional view of a light emitting diode according to various embodiments of one aspect of the present invention. The light emitting diode includes a light emitting structure layer 150 and an electrode structure 100. The electrode structure 100 includes a first diffusion barrier layer 110 formed over the light emitting structure layer 150. The material of the first diffusion barrier layer 110 is selected from a group consisting of chromium, platinum, palladium, nickel, rhodium, copper, tungsten, molybdenum, and a combination thereof. An aluminum reflective layer 120 is formed over the first diffusion barrier layer 110, wherein a thickness of the aluminum reflective layer 120 is in a range from about 500 to less than about 2,000 angstroms. A second diffusion barrier layer 130 is formed over the aluminum reflective layer. The material of the second diffusion barrier layer 130 is selected from a group consisting of chromium, platinum, palladium, nickel, rhodium, copper, tungsten, molybdenum, and a combination thereof. The material of the first diffusion barrier layer 110 and the second diffusion barrier layer 130 can be the same or different from each other. And an electrode layer 140 overlies the second diffusion barrier layer 130. The material of the electrode layer 140 is selected from a group consisting of gold, silver, titanium, nickel, and a combination thereof.

Figure 2:
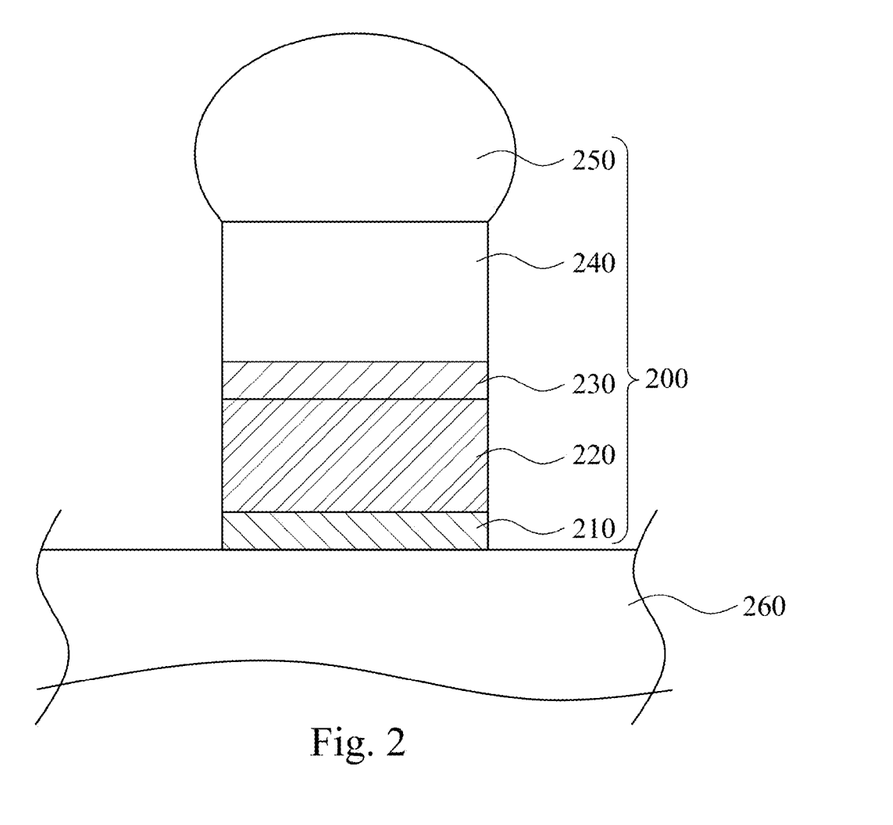
FIG. 2 is a cross sectional view of an electrode structure according to various embodiments of the present invention.

Referring to FIG. 2, FIG. 2 is a cross sectional view of an electrode structure according to various embodiments of the present invention. An electrode structure 200 is on a substrate 260. The substrate 260 is a silicon substrate, sapphire substrate, or a semiconductor device. The electrode structure 200 includes a first diffusion barrier layer 210, which is formed over the substrate 260. The material of the first diffusion barrier layer 210 is selected from a group consisting of chromium, platinum, palladium, nickel, rhodium, copper, tungsten, molybdenum, and a combination thereof. An aluminum reflective layer 220 is formed over the first diffusion barrier layer 210, wherein a thickness of the aluminum reflective layer 220 is in a range from about 500 to less than about 2,000 angstroms. A second diffusion barrier layer 230 is formed over the aluminum reflective layer 220. The material of the second diffusion barrier layer 230 is selected from a group consisting of chromium, platinum, palladium, nickel, rhodium, copper, tungsten, molybdenum, and a combination thereof. The material of the first diffusion barrier layer 210 and the second diffusion barrier layer 230 can be the same or different from each other. An electrode layer 240 overlies the second diffusion barrier layer. The material of the electrode layer 240 is selected from a group consisting of gold, silver, titanium, nickel, and a combination thereof. And a solder ball 250 is formed over the electrode layer 240. For example, a material of the solder ball 250 is gold.

Following are some experiments to further elaborate and prove the benefits of the present invention. However, the experiments are only for describing the invention, not used to limit the present invention. The scope of protection in the present invention is depending on the following claims.

Experiment 1: Electrode Adhesion Test

FIGS. 3A-3F are SEM images for the electrode structure with different height of reflective layer after an electrode adhesion test according to various embodiments of the present invention. According to various embodiments of the present invention, the electrode structure includes a gold solder bump. The substrate is a light emitting diode. When operating the electrode adhesion test, a knife or a blade may be used to remove the gold solder bump by external force, also to inspect the adhesion strength of the electrode structure. If the adhesion strength of the electrode structure is not enough, the electrode structure may be broken in the middle of the aluminum reflective layer and suffer peeling issue.

Figure 3A:
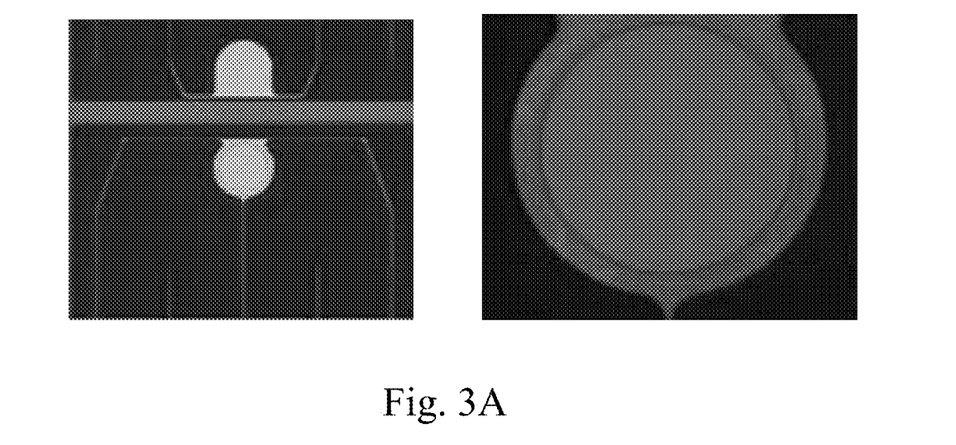
FIGS. 3A-3F are SEM photos for the electrode structure with different height reflective layer after an electrode adhesion test according to various embodiments of the present invention.

In these figures, the upper part of the left image shows an N electrode, and the lower part of the left image is a P electrode; the two electrodes are combined in one image for sake of the convenience of reference. And the right image in the figure is the enlarged view of the P electrode. Referring to FIG. 3A, FIG. 3A is the electrode structure before destruction. In view of the grayscales in the figure as a reference, it can be recognized whether or not the electrode structure is removed in comparison with the illustrations of other figures.

Figure 3B:
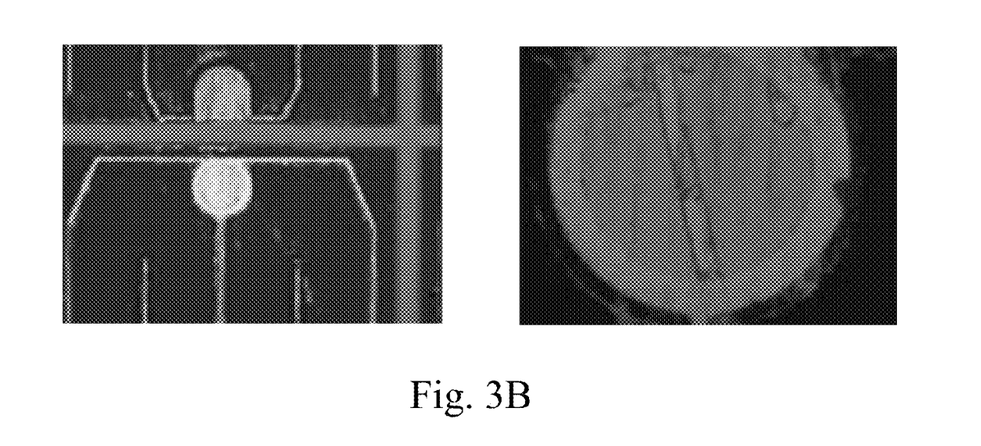

Referring to FIG. 3B, the thickness of the reflective layer in the electrode structure was 2,000 angstroms, which is normally used in products available in the market and thus taken as a control group. In the right image a scratch is shown with lighter color. Therefore, the product in the market still has a risk that parts of the electrode structure may be removed due to insufficient electrode adhesion.

Figure 3C:
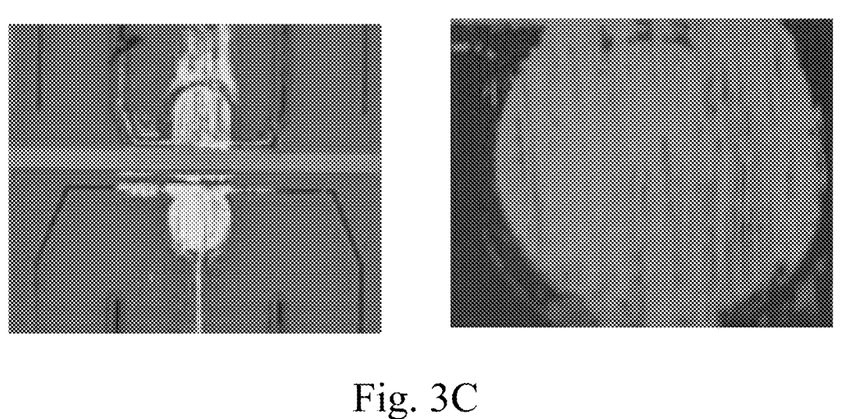

Referring to FIG. 3C, the reflective layer in the electrode structure in the FIG. 3C was increased to 12,000 angstroms. In contrast with FIG. 3A, after the electrode adhesion test, the color of the electrodes in both left and right picture became lighter. Once the thickness of the reflective layer was increased, the adhesion of the both electrodes structure decreased. The tougher electrode structure of N electrode was removed as well.

Figure 3D:
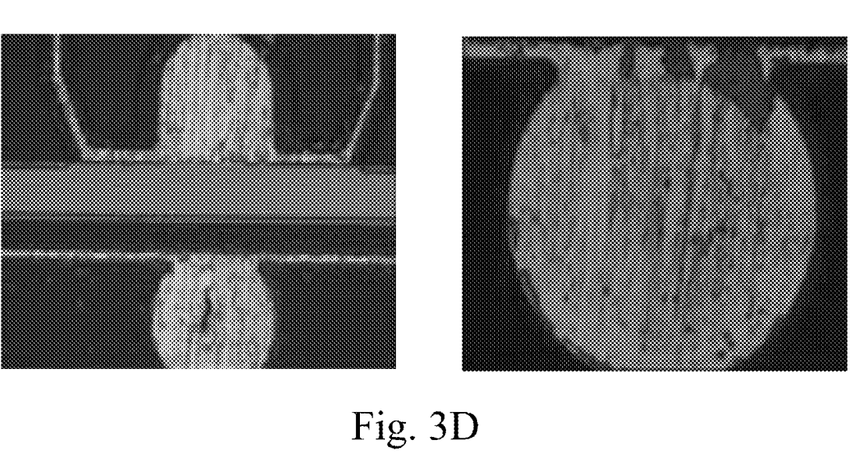
Figure 3E:
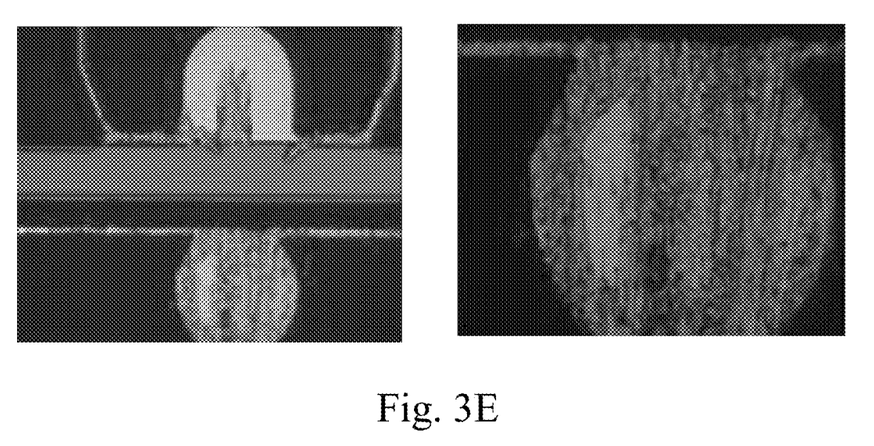
Figure 3F:
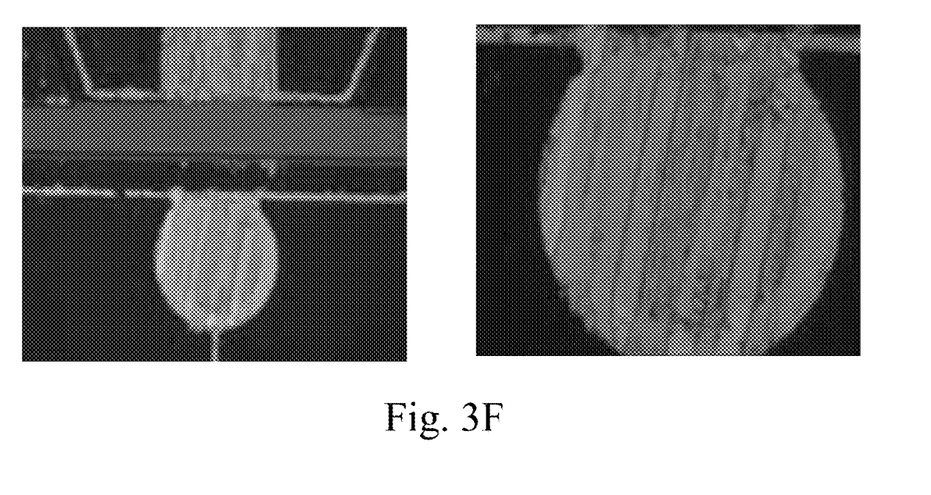

Referring to FIGS. 3D-3F, FIGS. 3D-3F are electrode adhesion test result for thinner reflective layer. The thickness of reflective layer in FIG. 3D is 500 angstroms, in FIG. 3E was 1,000 angstroms, and in FIG. 3F was 1,500 angstrom. Comparing to FIG. 3A, the grayscale of the lighter part of the electrode in the FIGS. 3D-3F is the same with that of the electrode in FIG. 3A, which means the peeling issue of the electrode structure did not happen during the electrode adhesion test. And the dark scratches in the FIGS. 3D-3F were the residues of the gold solder bump not completely removed. Unlike the illustrations of the FIGS. 3B and 3C, the light scratches are the residue of the aluminum reflective layer after the broken of the electrode structure.

Experiment 2: Peeling Area Material Test

Figure 4:
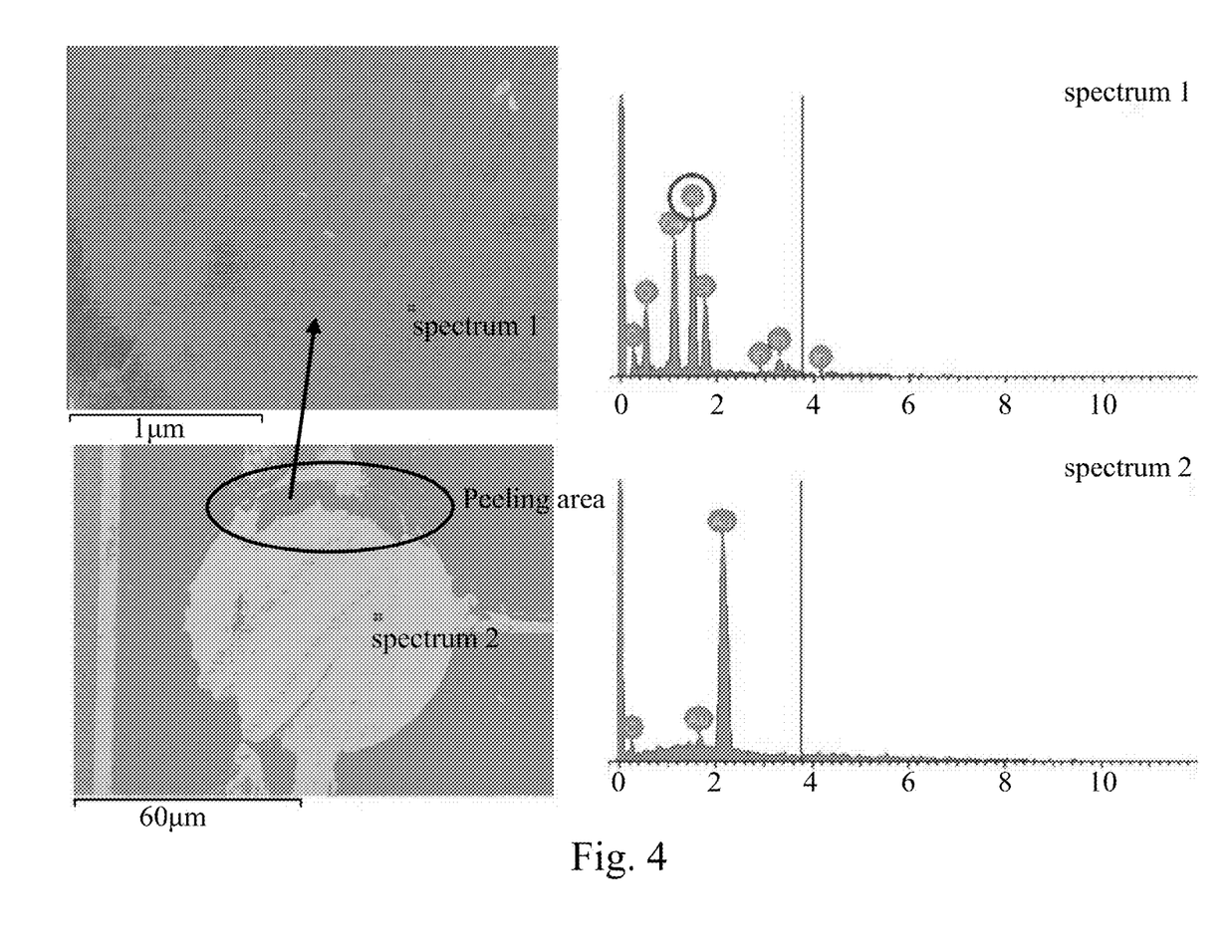
FIG. 4 is a SEM/EDX figure of a peeling area according to various embodiments of the present invention.

Referring to FIG. 4, FIG. 4 is a SEM/EDX figure of a peeling area according to various embodiments of the present invention. In the FIG. 4, the lower left image is an electrode having a peeling issue, and the upper left image is an enlarged view of the peeling area in the lower left image. The upper right and the lower right figure show EDX spectra for the surface chemical compound analysis for the spectrum 1 and spectrum 2, respectively. From the analysis of the EDX spectra, the major component at spectrum 1 in the peeling area is aluminum, which is the residual material after the electrode structure broke at the reflective layer. And the major component at spectrum 2 is gold, the material of the gold solder bump on the top of electrode structure, which means that the non peeling area still hold the integrity of the electrode structure.

Example 3: Burn-in Test

Figure 5:
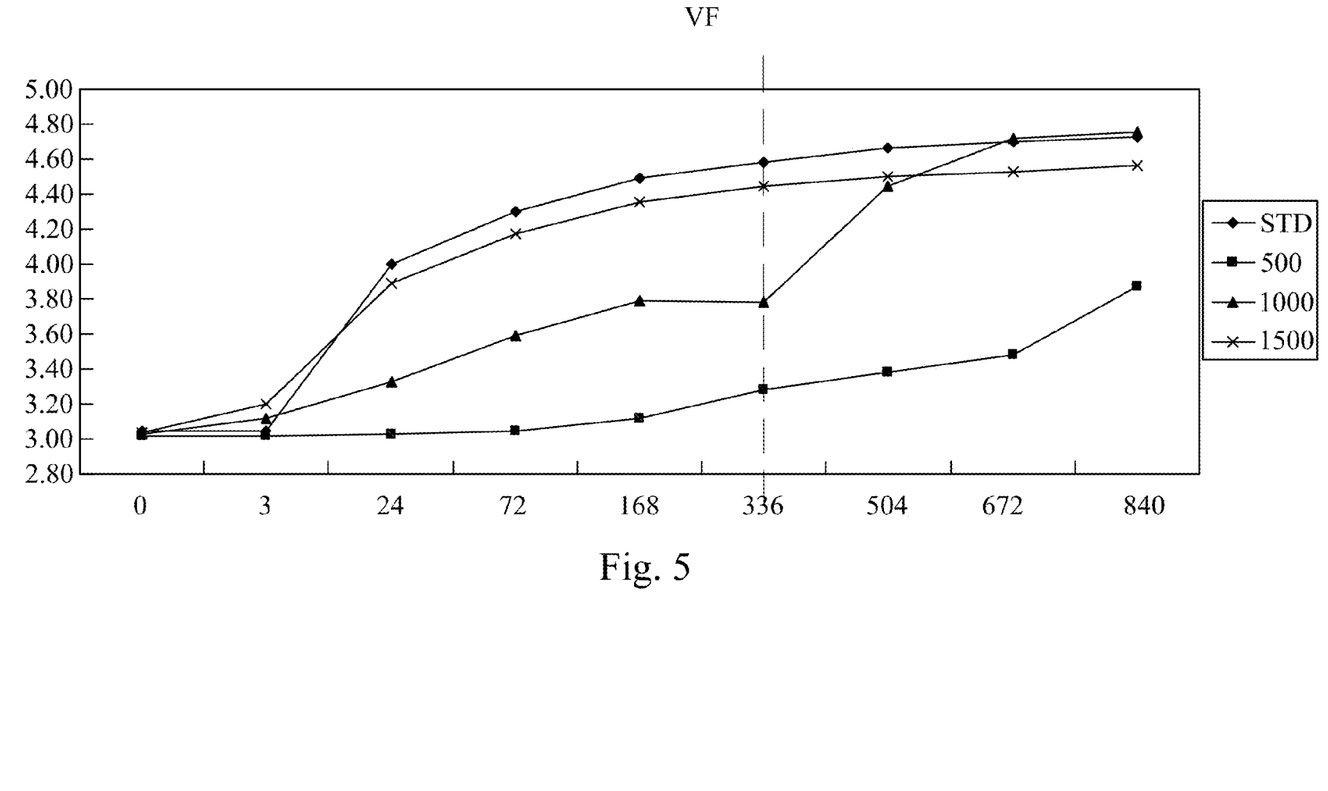
FIG. 5 is the results of the burn-in test according to various embodiments of the present invention.

Referring to FIG. 5, it shows the results of the burn-in test according to various embodiments of the present invention for further proving whether reducing the thickness of the aluminum reflective layer affects other performances. Data in the figure is the burn-in test result for a LED product including the electrode structure use 4 times of electric current for 840 hours. The figure illustrates the data for time versus forward voltage, in which the data STD means the thickness of the reflective layer was 2,000 angstroms, which is also the control group; the other three group of data are for the thickness of the reflective layer is 500, 1,000, and 1,500 angstroms. The result in the figure shows that, when the thickness of the reflective layer was 500 angstroms, the electrode was able to stand with the product criteria for 360 hours, and the forward voltage of other three groups were burned out within 24 hours. In the experiment, the result shows the burn out speed for the thickness of the reflective layer is 2,000>1,500>1,000>500 angstroms. Showing that decreasing the thickness of the reflective layer can increase the service life of the product. In contrast with the product for the thickness of the reflective layer being 2,000 angstroms, the reliability of the product for reducing the thickness of the aluminum reflective layer can increase over 50%. Also the burn-in experiment under twice amount of currents was conducted. The result shows that the product for reducing the thickness of the aluminum reflective layer was stable for time within 672 hours.

Experiment 4: Reflectivity Test

Generally believes that when the aluminum reflective layer is too thin, the reflection effect may decrease. Therefore a reflectivity test have been made, results are listed in the following table 1.

TABLE 1

Reflectivity of reflective layer for different thickness between the wavelengths in a range form 440 to 470 nm

| Aluminum layer thickness (Å) | Reflectivity % R (440-470 nm) | Reflectivity % R difference |
|---|---|---|
| 500 | 72.66 | −1.74 |
| 1000 | 73.85 | −0.55 |
| 2000 (STD) | 74.4 | STD |
| 12000 | 76.43 | 2.03 |

Even the results in the table shows that the reflectivity decrease with the decrease of the aluminum reflective layer, they can still be considered without significant difference in view of the whole efficacy and product quality requirements.

Experiment 5: Product Performance Test

Last, the product performance test have been made for the electrode structure with different thickness, the results are listed in table 2:

TABLE 2 product performance test

| Thickness of the aluminum reflective layer | Average brightness | Brightness difference | Average voltage | Voltage difference |
|---|---|---|---|---|
| First group: | | | | |
| 500 Å | 189.9 | −1% | 3.02 | 0.01 |
| 1,000 Å | 188.5 | −2% | 3.02 | 0.01 |
| 1,500 Å | 192.5 | 0% | 3.02 | 0.01 |
| 2,000 Å | 1920 | STD | 3.01 | — |

TABLE 2-continued product performance test

| Thickness of the aluminum reflective layer | Average brightness | Brightness difference | Average voltage | Voltage difference |
|---|---|---|---|---|
| Second group: | | | | |
| 500 Å | 188.6 | −1% | 3.00 | −0.04 |
| 1,000 Å | 190.6 | 0% | 3.02 | −0.02 |
| 1,500 Å | 188.2 | −2% | 3.04 | 0.00 |
| 2,000 Å | 191.1 | STD | 3.04 | — |

In the two groups of experiment, when the thickness of the aluminum reflective layer was 500 angstroms, the brightness decreases 1% in comparison with the control group (2,000 angstroms). When the thickness of the aluminum reflective layer was less than 500 angstroms, the product may have risk for decrease too much brightness.

From the above-mentioned experiments, in contrast with the thickness of the aluminum layer above and equal to 2,000 angstroms which may have peeling issue for the electrode structure due to the soft material property of aluminum compare with other metals. In some embodiments of the present invention, reducing the thickness of the aluminum reflective layer to less than 2,000 angstroms, for example, 1,500 or 1,000, to 500 angstroms can reduce the peeling issue, and makes no apparent change on the reflectivity, brightness, and voltage. Even though the thickness of the aluminum reflective layer is decreased to 500 angstroms, the reliability of the product and the product life can significantly be increased and, also the benefits in the reduction in the process fabricating time and the material consumption.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An electrode structure disposed on a semiconductor, comprising:
    a first diffusion barrier layer disposed on the semiconductor;
    an aluminum reflective layer formed over the first diffusion barrier layer, wherein a thickness of the aluminum reflective layer is in a range from about 500 to less than about 2,000 angstroms;
    a second diffusion barrier layer formed over the aluminum reflective layer;
    an electrode layer overlying the second diffusion barrier layer; and
    a solder ball disposed on the electrode layer.

2. The electrode structure of claim 1, wherein the electrode layer is made of a material comprising silver.

3. The electrode structure of claim 1, wherein a material of the electrode layer is selected from a group consisting of gold, silver, titanium, nickel, and a combination thereof.

4. The electrode structure of claim 1, wherein a material of the diffusion barrier layer is made of a material comprising chromium.

5. The electrode structure of claim 1, wherein a material of the diffusion barrier layer is selected from a group consisting of chromium, platinum, palladium, nickel, rhodium, copper, tungsten, molybdenum, and a combination thereof.

6. The electrode structure of claim 1, further comprising a solder ball formed over the electrode layer.

7. The electrode structure of claim 1, wherein the electrode structure is used in a light emitting diode, solar energy cell or secondary battery.

8. A light emitting diode, comprising:
a light emitting structure layer;
a first diffusion barrier layer formed over the light emitting structure layer;
an aluminum reflective layer formed over the first diffusion barrier layer, wherein a thickness of the aluminum reflective layer is in a range from about 500 to less than about 2,000 angstroms;
a second diffusion barrier layer formed over the aluminum reflective layer; and
an electrode layer overlying the second diffusion barrier layer.

9. The light emitting diode of claim 8, wherein the electrode layer is made of a material selected from a group consisting of chromium, platinum, palladium, nickel, rhodium, copper, tungsten, molybdenum, and a combination thereof.

10. The light emitting diode of claim 8, wherein a material of the diffusion barrier layer is selected from a group consisting of chromium, platinum, palladium, nickel, rhodium, copper, tungsten, molybdenum, and a combination thereof.

* * * * *